(12) United States Patent
Ikemoto

(10) Patent No.: US 8,283,857 B2
(45) Date of Patent: Oct. 9, 2012

(54) IMAGE DISPLAY APPARATUS

(75) Inventor: Kiyokatsu Ikemoto, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 17 days.

(21) Appl. No.: 12/844,461

(22) Filed: Jul. 27, 2010

(65) Prior Publication Data

US 2011/0025201 A1   Feb. 3, 2011

(30) Foreign Application Priority Data

Jul. 28, 2009 (JP) ................... 2009-174961

(51) Int. Cl.
*H01J 1/62* (2006.01)
(52) U.S. Cl. ........................ 313/506; 313/110
(58) Field of Classification Search .......... 313/110, 313/502–506
See application file for complete search history.

(56) References Cited

U.S. PATENT DOCUMENTS

| | | |
|---|---|---|
| 2002/0180348 A1 | 12/2002 | Oda et al. |
| 2003/0057417 A1 | 3/2003 | Lee et al. |
| 2003/0164496 A1 | 9/2003 | Do et al. |
| 2004/0169465 A1 | 9/2004 | Do et al. |
| 2006/0192483 A1 | 8/2006 | Nakanishi et al. |
| 2010/0090584 A1 | 4/2010 | Kawai et al. |

FOREIGN PATENT DOCUMENTS

| | | |
|---|---|---|
| CN | 1441629 A | 9/2003 |
| CN | 1535086 A | 10/2004 |
| JP | 10-188899 A | 7/1998 |
| JP | 2991183 B2 | 12/1999 |
| JP | 2004-335301 A | 11/2004 |
| JP | 2008-266628 A | 11/2008 |
| WO | WO2009081314 | * 7/2009 |

* cited by examiner

*Primary Examiner* — Anh Mai
*Assistant Examiner* — Brenitra Lee
(74) *Attorney, Agent, or Firm* — Canon U.S.A., Inc. IP Division

(57) ABSTRACT

An image display apparatus, which has a high contrast and can suppress the contrast variation and the effect of unwanted reflections regardless of the environment, comprises a luminescent layer; an excitation source which excites the luminescent layer; a front layer which obtains display light by transmitting light generated by the luminescent layer excited by the excitation source; and a periodic structure which is provided between the front layer and the luminescent layer and has a periodic refractive index distribution in a surface parallel to the front layer, wherein the periodic structure satisfies a relation of a following expression and the periodic interval of the periodic structure is 1 μm or greater and 3 μm or less. The expression being given by, $$1 < N_{sub} \leq N_{eff}$$

where $N_{eff}$ denotes an effective refractive index of the periodic structure and $N_{sub}$ denotes a refractive index of a medium constituting the front layer.

11 Claims, 8 Drawing Sheets

IMAGE DISPLAY APPARATUS

BACKGROUND OF THE INVENTION

1. Field of the Invention

The present invention relates to an image display apparatus which has a high contrast and reduces the contrast variation and the effect of unwanted reflections due to the surrounding environment.

2. Description of the Related Art

Conventionally, there have been proposed image display apparatuses of various configurations. As an example of this, there is known an image display apparatus configured as illustrated in a sectional view in FIG. 10A. The image display apparatus 1000 illustrated in FIG. 10A is configured to include a front layer 1001, a luminescent layer 1003 and an excitation source 1004, 1008 for exciting the luminescent layer 1003. The image display apparatus 1000 is configured by arranging a plurality of such configurations. The front layer 1001 is comprised of a medium transparent to visible light such as glass and plastics. The excitation source 1004 is configured, for example, such that an electron emission element and an electrode are arranged on a substrate and the electrode is provided between the front layer 1001 and the luminescent layer 1003. In this configuration, when an electric field is applied to the electron emission element, electrons are released and are supplied to the luminescent layer 1003. Thereby, light is produced by the luminescent layer 1003. Alternatively, as another configuration of the excitation source 1004, 1008, the excitation source 1004, 1008 is configured such that an anode and a cathode are provided on the front surface and the rear surface of the luminescent layer 1003 respectively. The light produced by the luminescent layer 1003 passes through the front layer 1001 and is extracted outside to form display light 1005.

The image display apparatus is required to have a high contrast. In order to improve the contrast of the image display apparatus in a bright place, it is necessary to improve the display luminance as well as to reduce outside light reflected light and reduce the minimum luminance in black display. Here, the outside light reflected light refers to light which is incident on the image display apparatus from outside, is reflected by the image display apparatus, and is emitted to outside. Further, the outside light reflected light can be classified into specularly reflected light and diffusely reflected light. The direction perpendicular to a screen of the image display apparatus is assumed to be the z axis. The specularly reflected light refers to light which is incident on the image display apparatus from a direction of an angle of θ to the z axis and is emitted to a direction of an angle of −θ to the z axis in the incident surface, of the light reflected by the image display apparatus. The diffusely reflected light refers to light other than the specularly reflected light, of the outside light which is incident on the image display apparatus from outside, is reflected by the image display apparatus, and is emitted to outside.

When outside light 1006 is incident on the image display apparatus 1000, strong reflected light occurs on an interface between the front layer 1001 and the excitation source 1004, an interface between the excitation source 1004 and the luminescent layer 1003, and a rear surface of the luminescent layer 1003, forming specularly reflected light 1007. The light reflected from the image display apparatus 1000 forms an image reflecting a surrounding fluorescent lamp and the background. When the light intensity of reflected light is large, a reflected image is recognized on the screen, thus blocking the view of the image display apparatus. Such a phenomenon is referred to as unwanted reflections. In order to increase the display light luminance of the image display apparatus 1000, it is important to reduce loss occurring from when the light is generated by the luminescent layer 1003 until the light is extracted outside. As a cause of this loss, there is a total reflection loss at an interface between the luminescent layer 1003 and the front layer 1001 and an interface between the front layer 1001 and an external region. When light propagates from a high refractive index medium to a low refractive index medium, the light propagating at an angle larger than a critical angle is fully reflected and the light is confined in the high refractive index medium. Such light is not extracted in the low refractive index medium and propagates in the high refractive index medium, consequently causing the loss.

As a method of reducing the total reflection loss and increasing the display light luminance, there has been proposed a method of providing a periodic structure between layers formed of a medium having a different refractive index. For example, Japanese Patent No. 2991183 discloses an organic electroluminescent element configured as illustrated in FIG. 10B. The image display apparatus (organic electroluminescent element) 1100 illustrated in FIG. 10B is configured to include a front layer 1101, a transparent electrode 1102, a luminescent layer 1103, and an electrode layer 1104. A periodic structure 1105 is provided between the front layer 1101 and the luminescent layer 1103. A refractive index distribution structure having a period substantially equal to the wavelength of light is used in the periodic structure 1105. Moreover, it is known that such periodic structure 1105 can increase light propagating at an angle equal to or smaller than the critical angle and can increase light extracted outside by diffracting light generating inside the luminescent layer 1103.

SUMMARY OF THE INVENTION

Unfortunately, the configuration of the image display apparatus disclosed as a conventional example in Japanese Patent No. 2991183 has a large reflection of outside light. Specifically, the image display apparatus disclosed in Japanese Patent No. 2991183 uses the periodic structure 1105 having a periodic interval substantially equal to or smaller than the wavelength of light. When outside light 1106 is incident on the periodic structure 1105, zeroth order reflected diffraction light 1107 and first order reflected diffraction light 1108 and 1109 are generated as the reflected light. The generated zeroth order diffraction light 1107 and first order diffraction light 1108 and 1109 propagate in a different direction according to the incident angle, the wavelength, and the diffraction order of the outside light. The light propagating at an angle equal to or smaller than the critical angle at a boundary between the front layer 1101 and outside is emitted outside, consequently forming outside light reflected light 1110. The reflected light generated by the periodic structure 1105 is distributed to any one of light: the zeroth order diffraction light 1107 and the first order diffraction light 1108 and 1109. Therefore, the light beam of each diffraction light beam has a large light intensity. Moreover, the intensity of each light beam also changes greatly according to the incident angle and the wavelength of the outside light. In general, when the image display apparatus is used in a bright place, light is incident from various directions depending on the environment. The diffraction light emitted to outside and the light intensity vary greatly according to the incident angle and the wavelength of the outside light, and the intensity of the outside light reflected light 1110 varies greatly. Moreover, each of the diffraction light beams 1107 and 1108 emitted to outside propagates in different direction and forms a reflected image to each direction. Each light beam has a large light intensity and thus images formed by each diffraction light beam become unwanted reflections blocking the view of the image display apparatus. As described above, the configuration of the image display apparatus disclosed in Japanese Patent No. 2991183 provides an image display apparatus which varies greatly in contrast and is greatly influenced by unwanted reflections depending on the environment of using the image display apparatus.

In view of the above problems, the present invention has been made, and an object of the present invention is to provide an image display apparatus which has a high contrast and can suppress the contrast variation and the effect of unwanted reflections regardless of the environment.

The present invention provides an image display apparatus configured as follows. The image display apparatus of the present invention comprises a periodic structure provided between a front layer and a luminescent layer; and an excitation source exciting the luminescent layer, wherein the front layer obtains display light by transmitting light generated in the luminescent layer excited by the excitation source through the periodic structure and the front layer, and the periodic structure has a periodic refractive index distribution in a surface parallel to the front layer and has a structure satisfying a relation of a following expression 1.

$$1 < N_{sub} \leq N_{eff} \qquad \text{Expression 1}$$

Where $N_{eff}$ is an effective refractive index of the periodic structure, and $N_{sub}$ is a refractive index of a medium constituting the front layer.

The present invention can provide an image display apparatus which has a high contrast and reduces the contrast variation and the effect of unwanted reflections regardless of the environment.

Further features of the present invention will become apparent from the following description of exemplary embodiments with reference to the attached drawings.

BRIEF DESCRIPTION OF THE DRAWINGS

FIG. 2A is an xy cross-sectional view of the periodic structure included in the image display apparatus according to the first embodiment of the present invention. FIG. 2B is an xz cross-sectional view thereof.

FIG. 10A is a cross-sectional view of the configuration of the image display apparatus according to the conventional example. FIG. 10B is a cross-sectional view of the configuration of the image display apparatus according to Japanese Patent No. 2991183.

DESCRIPTION OF THE EMBODIMENTS

Preferred embodiments of the present invention will now be described in detail in accordance with the accompanying drawings.

Modes for practicing the present invention will be described by referring to the following embodiments.

EMBODIMENTS

First Embodiment

Figure 1:
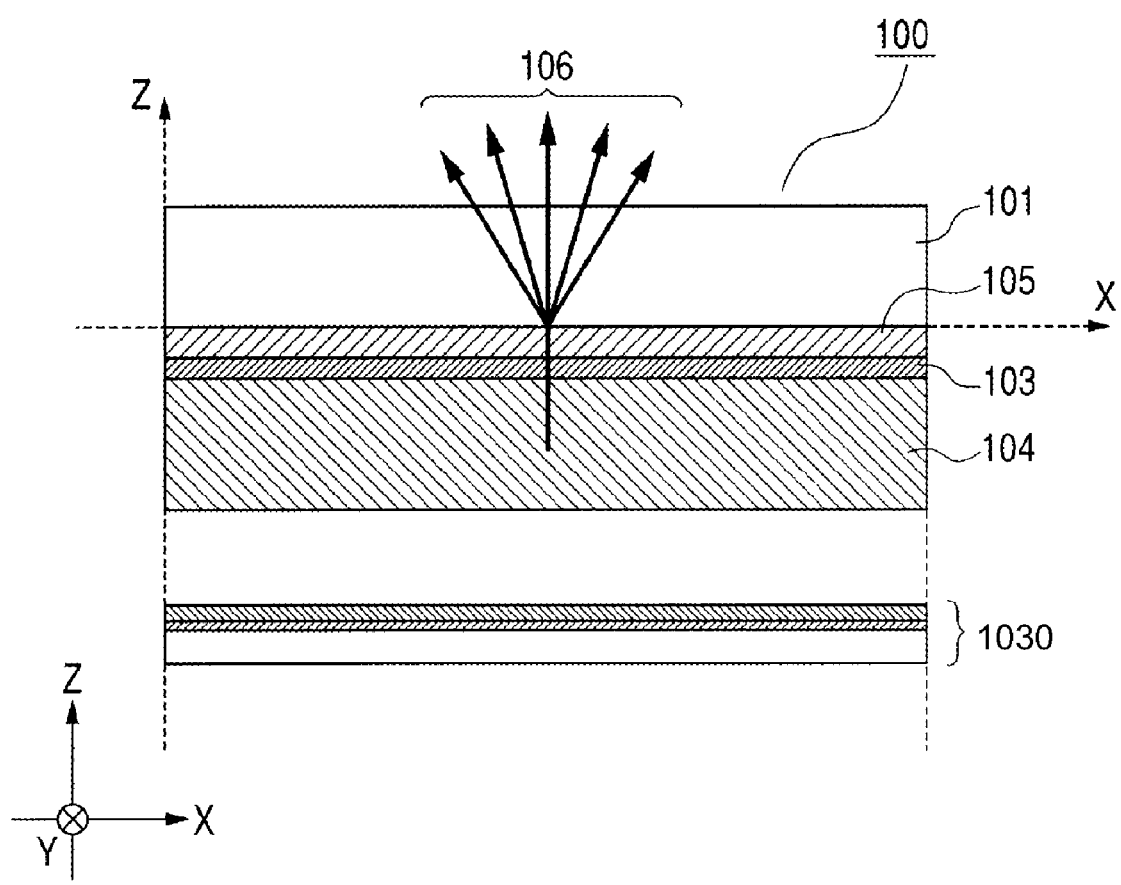
FIG. 1 is an xz cross-sectional view describing a configuration of an image display apparatus according to a first embodiment of the present invention.

First, by referring to FIG. 1, a schematic configuration of the image display apparatus will be described. The image display apparatus 100 illustrated in the xz cross-sectional view of FIG. 1 includes a front layer 101 and on the rear surface thereof, an excitation source (excitation unit) 103 or 1030, a luminescent layer 104, and a periodic structure 105. FIG. 1 illustrates a part of the image display apparatus 100. The image display apparatus 100 is configured by arranging a plurality of such configurations and separating each configuration by a black matrix included a medium having light absorption properties. The front layer 101 is included a medium transparent to visible light such as glass. The luminescent layer 104 is, for example, a layer containing a fluorescent material and is included a medium which emits light containing wavelengths in the visible wavelength range of 350 nm or more and 800 nm or less. The periodic structure 105 is included two or more media having a different refractive index and has a structure having a periodic refractive index distribution in an xy plane parallel to a screen surface.

Figure 2A:
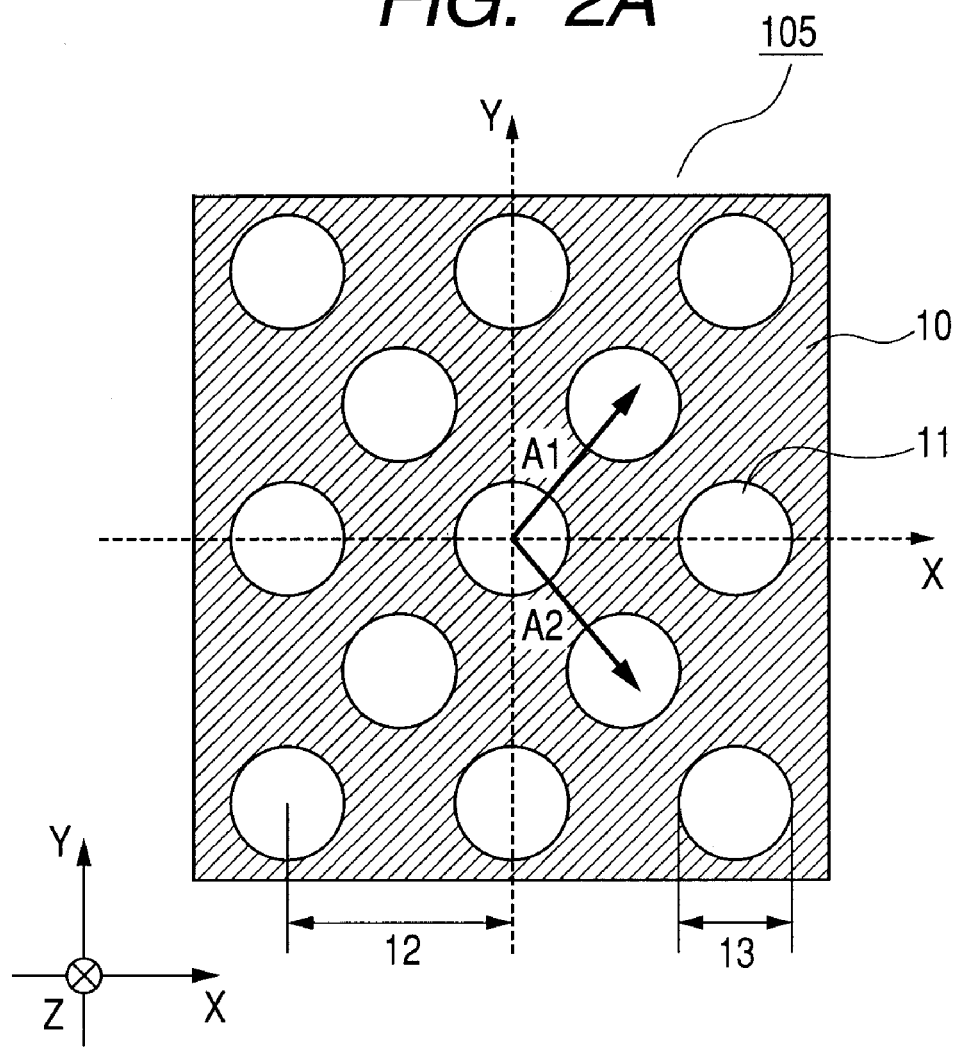
FIGS. 2A and 2B each describe a configuration example of a periodic structure according to the first embodiment of the present invention.
Figure 2B:
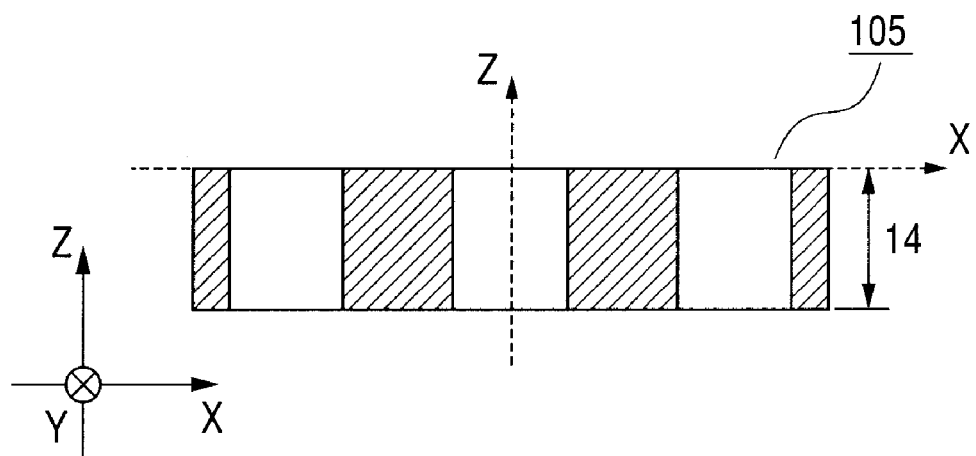

Next, by referring to FIGS. 2A and 2B, the description will focus on a configuration example of the periodic structure 105 in which, in layers included a first medium according to the present embodiment, cylindrical structures included a second medium different from the first medium are arranged. The periodic structure 105 has a structure in which the cylindrical structures 11 included the second medium are arranged two-dimensionally periodically into a layer 10 included the first medium. Assuming that vectors A1 and A2 illustrated in FIG. 2A are basic vectors, the periodic structure 105 has a triangular lattice structure in which the cylindrical structures 11 are arranged in a triangular lattice shape at a position expressed by a sum or difference of the basic vectors. Assuming that the periodic interval 12 (length of grating period 12) of the periodic structure is a, the vector A1 is a vector (0.5a, √3a/2, 0.0) and the vector A2 is a vector (0.5a, −√3a/2, 0.0). The length of the grating period 12 is set to a length allowing a light beam incident on the periodic structure 105 to be distributed to a plurality of diffraction light beams. The front layer 101 is included a medium having a refractive index larger than the refractive index of air which is an external region and equal to or less than the effective refractive index $N_{eff}$ of the periodic structure 105.

The excitation source 103 includes a unit for injecting electrons into the luminescent layer 104. For example, the excitation source 103 is configured such that an electron emission element and an electrode are provided. More specifically, the excitation source 103 is configured such that a transparent electrode is provided between the luminescent layer 104 and the periodic structure 105 and the electron emission element is provided, a region of a rear surface of the luminescent layer 104. In this configuration, when an electric field is applied to the electron emission element, electrons are released to the luminescent layer 104 and the electrons are supplied to the luminescent layer 104, where light is produced. The produced light passes through the periodic structure 105 and the front layer 101 and is extracted outside to form display light 106 propagating in the +z axial direction. When light is incident on the image display apparatus 100 from outside thereof, the light passes through an interface between the external region and the front layer 101 and reaches the periodic structure 105. The light which reached the periodic structure 105 is diffracted by two-dimensional periodic refractive index distribution of the periodic structure 105 and is distributed to a plurality of diffraction light beams. The diffraction light beams propagate in a different direction depending on the diffraction order. Here, of the diffraction light, light advancing in +z axial direction is referred to as reflected diffraction light, and light advancing in −z axial direction is referred to as transmitted diffraction light.

Figure 3:
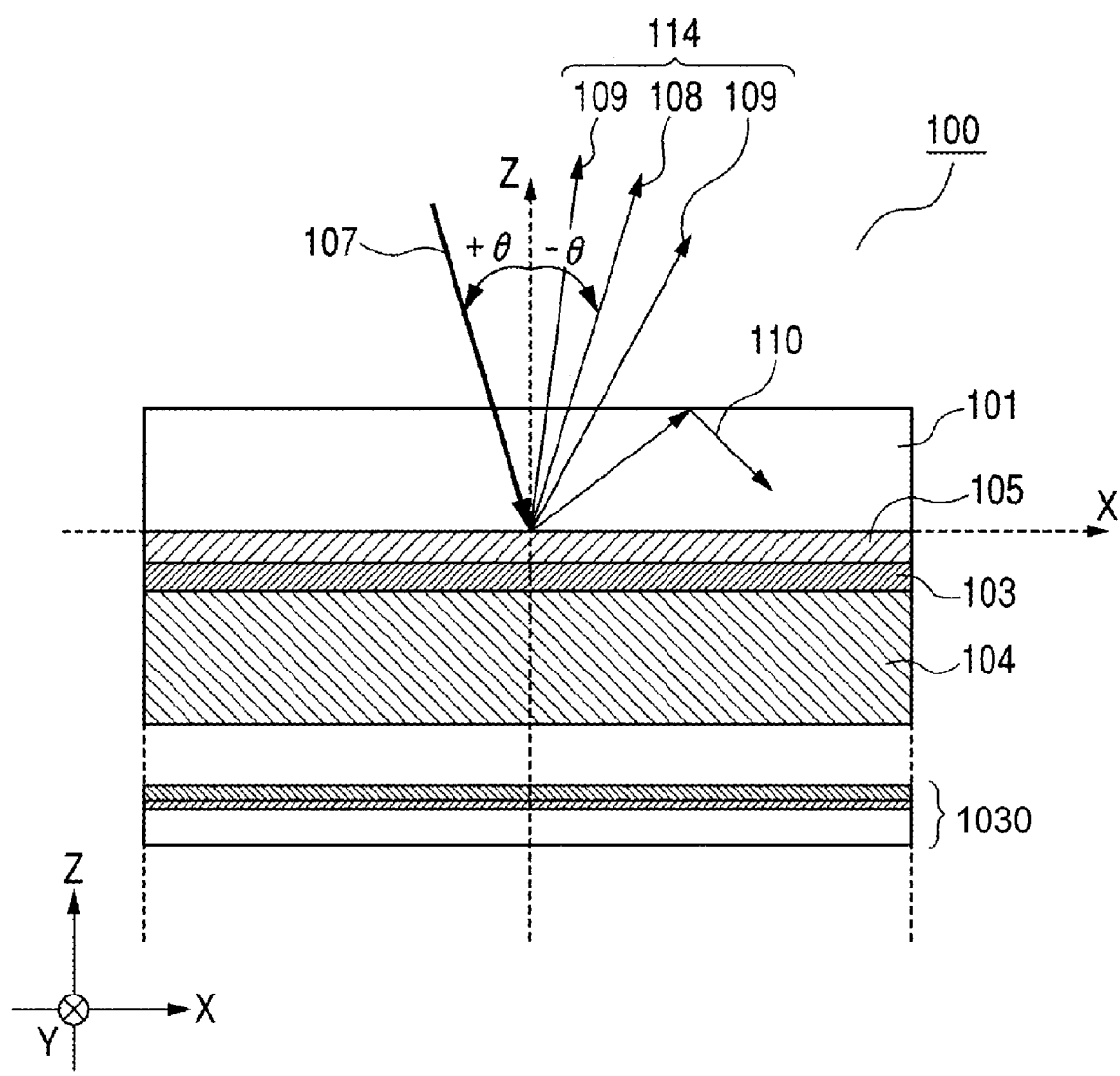
FIG. 3 is an xz cross-sectional view of the image display apparatus describing the process that when outside light is incident on the image display apparatus according to the first embodiment of the present invention from outside thereof, reflected diffraction light generated by the periodic structure propagates.

By referring to FIG. 3, the description will focus on the process that when outside light 107 is incident on the image display apparatus 100 from outside thereof, reflected diffraction light generated by the periodic structure 105 propagates. The image display apparatus illustrated in FIG. 3 has the same configuration as the image display apparatus illustrated in FIG. 1. Of the reflected diffraction light, the light propagating at an angle larger than a critical angle on an interface between the front layer 101 and the external region is fully reflected on the interface. The fully reflected light is not released outside but propagates in the front layer 101 and is absorbed by a black matrix which is not illustrated in FIG. 3 but is provided at the periphery and decays. The light is referred to as decay light 110. Meanwhile, the diffraction light propagating at an angle smaller than the critical angle is released outside and forms outside light reflected light 114. When outside light is incident at an angle of +θ to the z axis, light propagating in the −θ direction to the z axis is referred to as specularly reflected light 108 and light propagating in the other directions to the z axis is referred to as diffusely reflected light 109.

Figure 4:
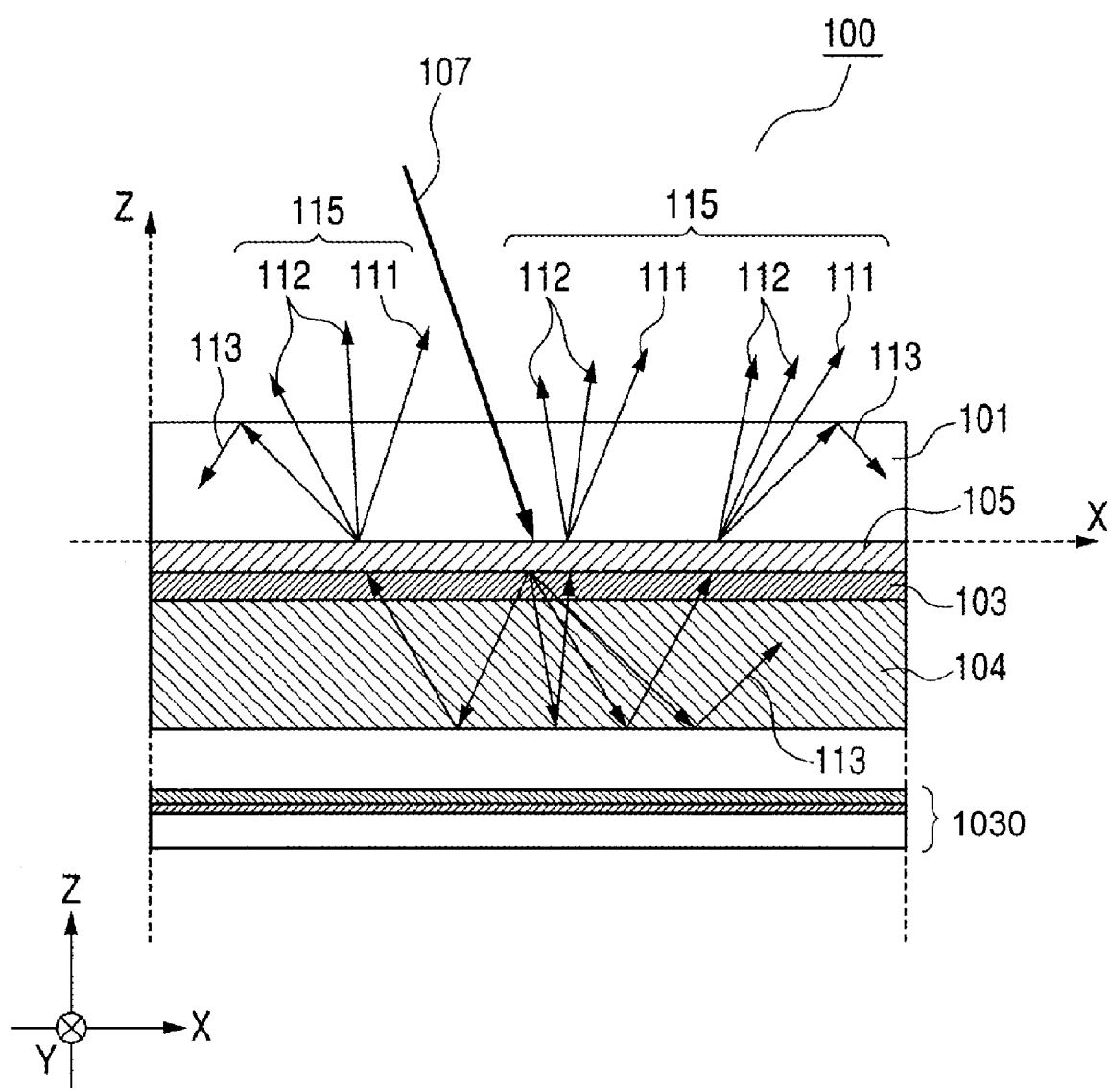
FIG. 4 is an xz cross-sectional view of the image display apparatus describing the process that when outside light is incident on the image display apparatus according to the first embodiment of the present invention from outside thereof, transmitted diffraction light generated by the periodic structure propagates.

By referring to FIG. 4, the description will focus on the process that when the outside light 107 is incident on the image display apparatus 100 from outside thereof, transmitted diffraction light generated by the periodic structure 105 propagates. The image display apparatus illustrated in FIG. 4 has the same configuration as the image display apparatus illustrated in FIG. 1. The transmitted diffraction light is distributed to a plurality of diffraction light beams and propagates in a direction according to each diffraction order. Each diffraction light beam propagates in the luminescent layer 104, in which some are reflected on a rear surface of the luminescent layer 104 and others are transmitted. The reflected light beams propagate again in the luminescent layer 104 and are diffracted by the periodic structure 105 and are distributed to a plurality of diffraction light beams. Of the diffraction light beams, some become reflected diffraction light beams which are repeatedly subjected to reflection on the rear surface of the luminescent layer 104 and diffraction by the periodic structure 105 and propagate in the luminescent layer 104 in a direction within the xy plane. Then, the reflected diffraction light beams reach a black matrix which is not illustrated in FIG. 4 but is provided at the periphery and are absorbed thereby. Of the diffraction light propagating in the front layer 101, the light propagating at an angle larger than a critical angle on an interface between the front layer 101 and the external region is not released outside but propagates in the front layer 101 and is absorbed by the black matrix and decays. The light decaying at this time and the light absorbed on the rear surface of the luminescent layer 104 and a side wall provided at the periphery are collectively called decay light 113. Meanwhile, the diffraction light propagating at an angle smaller than the critical angle is released outside and forms outside light reflected light 115. At this time, light propagating in the −θ direction with respect to an outside light incident angle +θ is referred to as specularly reflected light 111 and light propagating in the other directions is referred to as diffusely reflected light 112.

Next, the description will focus on the reason why the image display apparatus 100 according to the present embodiment can provide an image display apparatus which has a high contrast and reduces the contrast variation and the effect of unwanted reflections regardless of the environment. First, the refractive index conditions of the front layer and the periodic structure will be described. The periodic structure 105 has a structure satisfying the relation of the following expression 1.

$$1 < N_{sub} \leq N_{eff} \quad \text{Expression 1}$$

In the expression 1, $N_{sub}$ denotes a refractive index of a medium constituting the front layer 101. The periodic structure 105 is approximated as a layer having a homogeneous refractive index and the refractive index at that time is defined as an effective refractive index. $N_{eff}$ denotes an effective refractive index of the periodic structure 105 and can be expressed as the following expression 2.

$$N_{eff} = \sqrt{\in_1 \times f_1 + \in_2 \times f_2} \quad \text{Expression 2}$$

In the expression 2, $N_{eff}$ denotes an effective refractive index of the periodic structure 105. $\in_1$ and $\in_2$ denote respective dielectric constants of the first medium and second medium constituting the periodic structure 105. $f_1$ and $f_2$ denote respective filling rates of the first medium and the second medium included in the periodic structure 105 and indicate ratios of areas occupied by respective media in the xy cross section of the periodic structure 105. The intensity of the outside light reflected light occurring at an interface between the front layer 101 and the periodic structure 105 depends on the reflectance at an interface between the front layer 101 and the layer having the effective refractive index $N_{eff}$. The smaller the difference between the refractive index of the front layer 101 and the effective refractive index $N_{eff}$ of the periodic structure 105, the smaller the reflectance on the interface and the intensity of the outside light reflected light is reduced. The front layer 101 is disposed between the external region and the periodic structure 105. Then, the front layer 101 and the periodic structure 105 is configured such that the expression 1 is satisfied, that is, the refractive index of the medium constituting the front layer 101 is larger than the refractive index of air which is an external region and equal to or less than the effective refractive index $N_{eff}$ of the periodic structure 105. This can reduce the difference between the effective refractive index $N_{eff}$ of the periodic structure 105 and the refractive index of the adjacent region and can reduce the intensity of the outside light reflected light 114 occurring on a surface of the periodic structure 105. This can provide an image display apparatus which reduces outside light reflected light and has a high contrast.

Next, the grating period conditions of the periodic structure will be described. The length of the grating period 12 of the periodic structure 105 according to the present embodiment is determined as a length allowing a light beam incident on the periodic structure 105 to be distributed to a plurality of diffraction light beams. When light is made incident on the periodic structure, the light of a diffraction order satisfying the relation of the following expression 3 occurs.

$$N_{in} \sin \theta_{in} + m\lambda/\Lambda < N_{out} \qquad \text{Expression 3}$$

(wherein m is an arbitrary integer)

Figure 5:
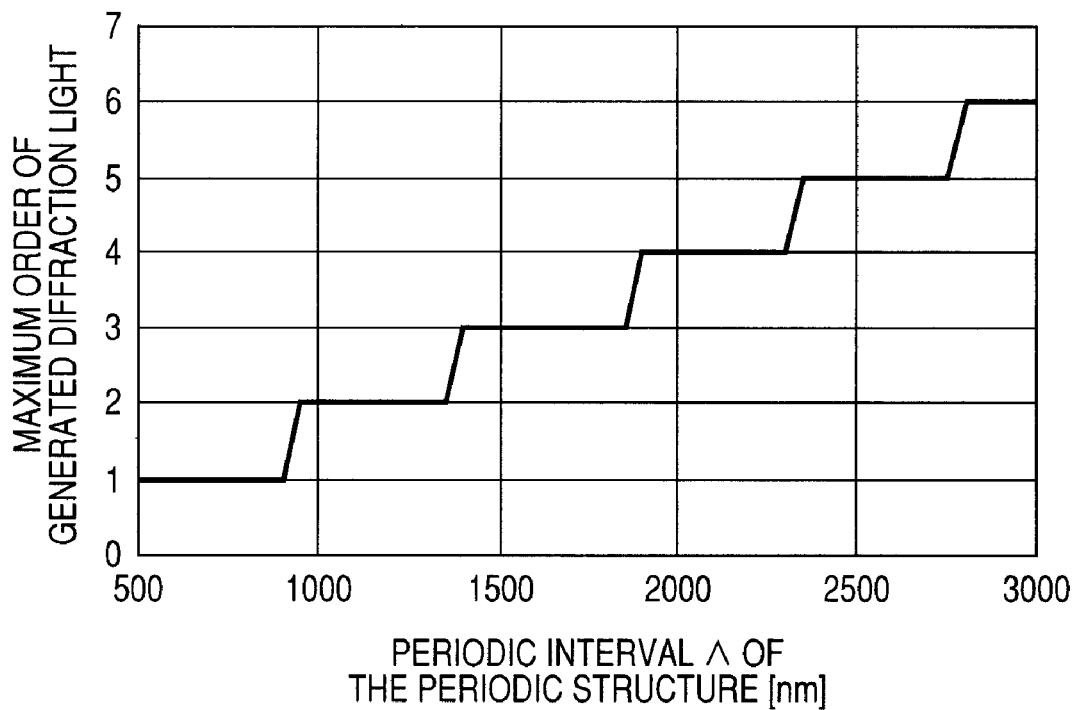
FIG. 5 is a graph illustrating the results of calculating the order of diffraction light according to the first embodiment of the present invention.

In the above expression 3, $\lambda$ denotes a wavelength of incident light; $N_{in}$ denotes a refractive index of a region in which incident light propagates; and $N_{out}$ denotes a refractive index of a region in which reflected diffraction light or transmitted diffraction light propagates. $\theta_{in}$ denotes an angle between an incident direction of the incident light and a direction perpendicular to the periodic structure; $\Lambda$ denotes a periodic interval of the periodic structure; and m denotes any integer of diffraction order. FIG. 5 illustrates maximum order of reflected diffraction light generated when outside light is made incident on the image display apparatus according to the present embodiment. In FIG. 5, the horizontal axis indicates the length of the grating period 12 of the periodic structure 105 and the vertical axis indicates the maximum diffraction order of generated reflected diffraction light. In the above expression 3, the refractive indices $N_{in}$ and $N_{out}$ of a region in which incident light and diffraction light propagate are set to 1.5 which is the same as the refractive index of a generally used glass substrate and the incident angle $\theta_{in}$ of outside light is set to 0 degree indicating a direction perpendicular to the periodic structure. The longer the wavelength the more difficult it is for higher order diffraction light to occur and thus the wavelength is set to 700 nm by selecting a wavelength corresponding to a long wavelength side of the visible range. As illustrated in FIG. 5, when the periodic interval 12 (grating period length 12) of the periodic structure 105 is set to 1 µm or more, second or higher order of diffraction light occurs. Thus, it is possible to generate more number of diffraction light beams than a periodic structure according to a conventional configuration. Further, preferably, when the periodic interval 12 (grating period length 12) of the periodic structure 105 is set to 1.5 µm or more, third or higher order of diffraction light occurs. Thus, it is further possible to generate more number of diffraction light beams.

When the outside light 107 is incident on a structure having such a grating period, the outside light 107 is distributed to a large number of reflected diffraction light beams and transmitted diffraction light beams. In FIG. 3, the reflected light beams generated by the periodic structure 105 are distributed to a zeroth order reflected diffraction light (specularly reflected light) beam 108 and a large number of reflected diffraction light beams 109 and 110 having a first and second or higher order. At this time, the reflected light beams are distributed to a large number of reflected diffraction light beams and thus the intensity of each light beam becomes small. The outside light reflected light beams 114 become light integrating a large number of reflected diffraction light beams 108 and 109 with a small intensity. Likewise, in FIG. 4, the transmitted light beams are distributed to a zeroth order transmitted diffraction light beam and a large number of transmitted diffraction light beams having a first and second or higher order. Each transmitted diffraction light beam is reflected on a rear surface of the luminescent layer 104, then is incident on the periodic structure 105, further is distributed to a large number of transmitted diffraction light beams, and then some transmitted diffraction light beams 111 and 112 become outside light reflected light beams 115. While outside light beams are being emitted outside, the outside light beams are distributed to a large number of transmitted diffraction light beams and thus the intensity of each light beam of the transmitted diffraction light beams 111 and 112 becomes extremely small. The outside light reflected light beams 115 become light integrating a large number of transmitted diffraction light beams 111 and 112 with a small intensity. Even if the incident angle and the wavelength of an outside light beam are varied, the outside light beam is distributed to a large number of reflected diffraction light beams and transmitted diffraction light beams and thus the variation of the intensity of each light beam is small and the variations of the outside light reflected light beams 114 and the outside light reflected light beams 115 which are light integrating a large number of light beams also become small. Moreover, the intensity of each light beam is small and thus it is difficult to observe reflected images formed by each diffraction light beam. The above effects allow the configuration of the image display apparatus 100 according to the present embodiment to provide an image display apparatus which reduces the contrast variation and the effect of unwanted reflections regardless of the surrounding environment. Note that the longer the grating period 12, the smaller the intensity of high order diffraction light beams and the intensity of a zeroth order diffraction light beam is increased. Therefore, as described above, specularly reflected light (zeroth order reflected diffraction light) is increased and display light luminance is reduced. It is desirable that the length of the grating period of the periodic structure is equal to or less than 3 µm, and it is further desirable that the period is equal to or less than 2.5 µm. The periodic structure having a periodic interval in the above range can provide an image display apparatus which has a high contrast and reduces the contrast variation and the effect of unwanted reflections regardless of the environment.

Further, the image display apparatus 100 according to the present embodiment can reduce variation in luminance of display light in a wide viewing angle. In the image display apparatus 100, light generated by the luminescent layer 104 propagates in various directions. A light beam incident on the periodic structure 105 in each direction is diffracted and distributed to a zeroth order light beam and a large number of transmitted diffraction light beams and reflected diffraction light beams having a first and second or higher order. At this time, transmitted diffraction light becomes diffraction light which propagates in various directions in a wide range of angle and has a small difference in light intensity. The reflected diffraction light beams propagate in the luminescent layer 104, are reflected on the rear surface of the luminescent layer 104, are incident on the periodic structure 105 again, and are distributed to a large number of diffraction light beams. Further, such transmitted diffraction light becomes diffraction light which propagates in various directions in a wide range of angle and has a small difference in light intensity. Of the transmitted diffraction light, light integrating light emitted outside becomes display light. The display light beams emitted in various directions become light beams generated from light beams incident on the periodic structure 105 from various angles and integrating a large number of transmitted diffraction light beams. Therefore, there can be obtained characteristics that the angle and the intensity of light incident on the periodic structure 105 less affect the luminance of the display light beams emitted in each direction and there is a small difference in luminance of the display light in a wide viewing range.

Moreover, the present embodiment can reduce outside light reflected light by installing the periodic structure 105 and appropriately designing the structure. In FIG. 3, when outside light is diffracted to generate the decay light 110, the intensity of other diffraction light is reduced and thus outside light reflected light 114 emitted outside can be reduced. Moreover, the outside light reflected light 114 is distributed to the specularly reflected light 108 and the diffusely reflected light 109. Therefore, in comparison with a configuration without the periodic structure 105, the specularly reflected light 108 is reduced. Moreover, of the transmitted diffraction light illustrated in FIG. 4, the larger the decay light 113, the intensity of other diffraction light is reduced. Therefore, the outside light reflected light 115 emitted outside is reduced. Moreover, the outside light reflected light 115 is distributed to the specularly reflected light 111 and the diffusely reflected light 112. Therefore, in comparison with a configuration without the periodic structure 105, the specularly reflected light 111 is reduced. As described above, the image display apparatus 100 according to the present embodiment can generate diffraction light and decay light by providing the periodic structure 105 between the front layer 101 and the luminescent layer 104 and appropriately designing the periodic structure 105. Moreover, the image display apparatus 100 can reduce outside light reflected light by generating decay light. Further, the image display apparatus 100 can generate diffraction light by the periodic structure 105, thereby distributing outside light reflected light to specularly reflected light and diffusely reflected light and reducing specularly reflected light.

Further, an example of the periodic structure 105 included in the image display apparatus 100 according to the present embodiment will be described. In the periodic structure 105 illustrated in FIGS. 2A and 2B, the grating period 12 has a length of 1700 nm, the diameter 13 of a cylinder 11 has a length of 1450 nm, and the length 14 in the xz cross section of the periodic structure 105 is 1450 nm. The refractive index of the second medium constituting the cylinder 11 is 2.2, and the refractive index of the first medium constituting the surrounding region 10 is 1.5. The front layer 101 is included a medium with a refractive index of 1.5, and the luminescent layer 104 is included a medium with a refractive index of 1.5. Moreover, the excitation source 103 is configured such that a transparent electrode is provided between the luminescent layer 104 and the periodic structure 105 and an electron emission element is provided the region of the rear surface of the luminescent layer 104, and the region of the rear surface is vacuum state.

Figure 6:
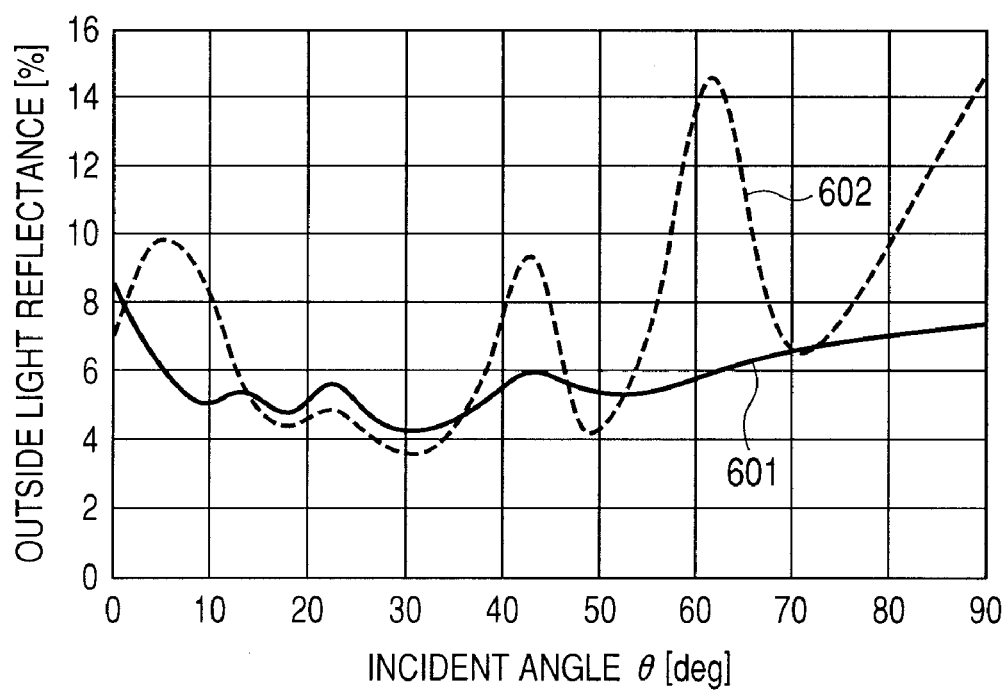
FIG. 6 is a graph illustrating the results of calculating outside light reflectance according to the first embodiment of the present invention.

FIG. 6 illustrates the intensity of outside light reflected light when outside light is made incident on the image display apparatus. In FIG. 6, the horizontal axis indicates an angle between an outside light incident direction and a direction perpendicular to the screen and the vertical axis indicates outside light reflectance. Further, FIG. 6 also illustrates outside light reflectance of an image display apparatus including a periodic structure according to a conventional configuration. In FIG. 6, a dotted line 602 indicates characteristics of the conventional configuration and a solid line 601 indicates characteristics of the configuration according to the present embodiment. The periodic structure according to the conventional configuration is such that in the periodic structure 105 illustrated in FIGS. 2A and 2B, the length of the grating period 12 is 700 nm which is substantially equal to the wavelength of light, the diameter 13 of the cylinder 11 is 600 nm, and the length 14 in the xz cross section is 600 nm. The diameter 13 of the cylinder 11 is determined such that in the periodic structure 105 illustrated as an example of the present embodiment, the ratio between the areas occupied by the first medium and the second medium in the xy cross section is the same. Moreover, the length 14 in the xz cross section is determined such that in the periodic structure 105 illustrated as an example of the present embodiment, the ratio between the diameter 13 of the cylinder 11 and the length 14 of the cross section is the same. The refractive index of a medium constituting the cylinder 11, the surrounding region 10, the front layer 101, and the luminescent layer 104 is the same as the refractive index of the present embodiment. Note that reflected light at an interface between the front layer 101 and the external region and reflected light from an interface between the luminescent layer and the rear region are ignored. Moreover, the outside light reflectance is calculated by the transfer matrix method. As illustrated in FIG. 6, according to the conventional configuration, when an outside light beam is incident from a direction approximately 5 degrees, approximately 43 degrees, approximately 62 degrees, and 75 or more degrees, outside light reflectance rapidly increases. This indicates that when the image display apparatus is used in an environment in which outside light is incident from the above directions, outside light reflection is increased and the contrast is reduced. In contrast to this, as illustrated in FIG. 6, the configuration according to the present embodiment can provide characteristics that even if the incident angle of the outside light is changed, the variation of the outside light reflectance is small. This can provide an image display apparatus which has a small contrast variation regardless of the surrounding environment.

Figure 7:
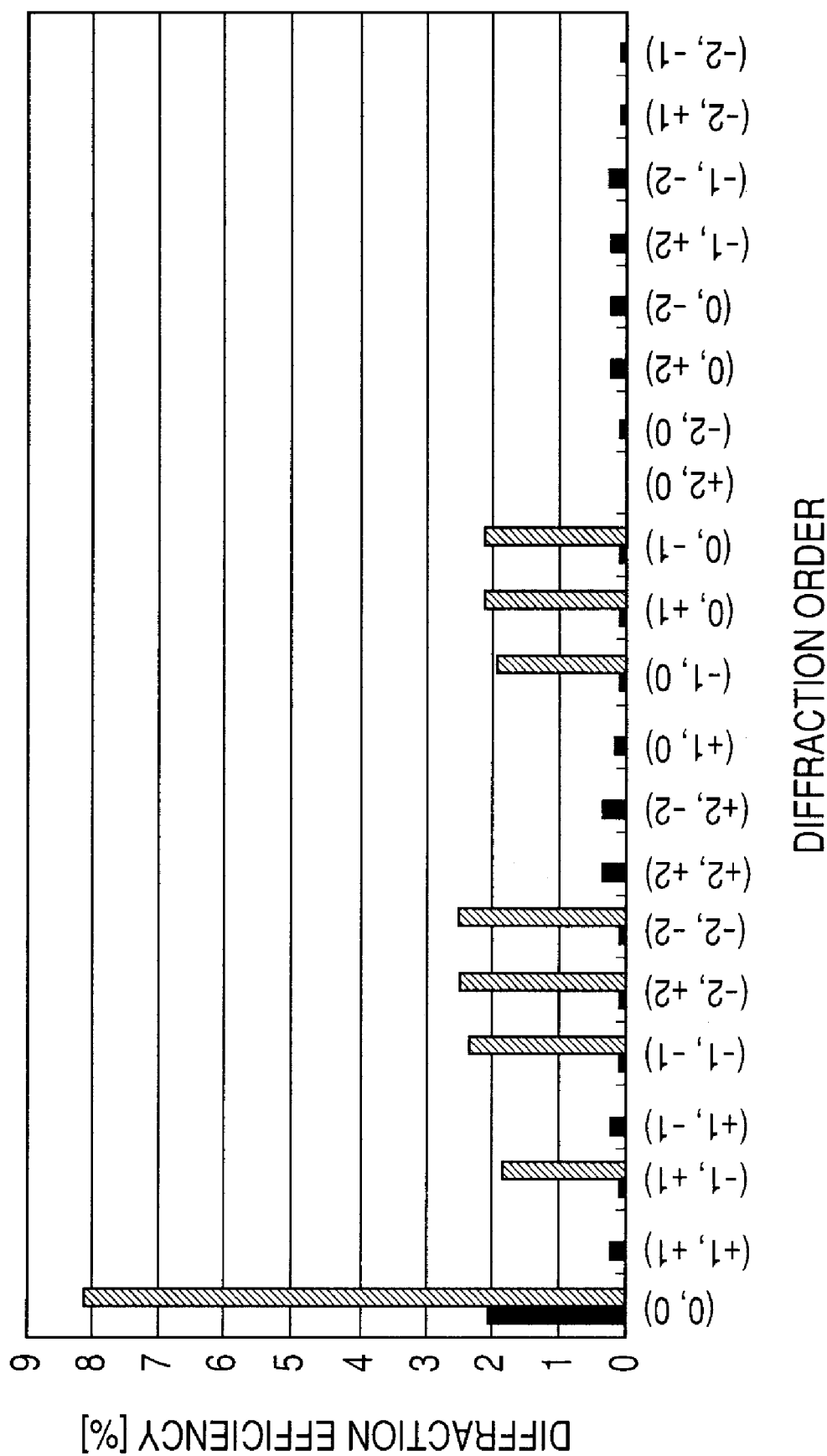
FIG. 7 is a graph illustrating the results of calculating a diffraction efficiency of reflected light according to the first embodiment of the present invention.

Next, by referring to FIG. 7, in the image display apparatus 100 according to the present embodiment, the description will focus on a diffraction efficiency of each reflected diffraction light beam generated by the periodic structure 105 when outside light is incident on the image display apparatus 100. In FIG. 7, the horizontal axis indicates diffraction order of the reflected diffraction light and the vertical axis indicates diffraction efficiency. Further, FIG. 7 illustrates diffraction efficiency of each diffraction light beam when outside light under the same conditions is incident on the image display apparatus including the periodic structure according to the conventional configuration. In FIG. 7, a black solid bar indicates characteristics of the configuration according to the present embodiment and a shaded bar indicates characteristics of the conventional configuration. Each reflected diffraction light beam propagates in a different direction and forms a reflected image. A diffraction light beam with a large diffraction efficiency generates a strong reflected light beam, causing unwanted reflections blocking the view of the image display apparatus. Incident outside light has a wavelength of 550 nm sensitive to human eyes and is incident from a direction at 45 degrees to a direction perpendicular to the image display apparatus. The periodic structure according to the conventional configuration has the same configuration as described above. As illustrated in FIG. 7, in comparison with the conventional configuration, the periodic structure 105 according to the present embodiment can provide a smaller diffraction efficiency of each diffraction order and more number of diffraction light beams. The configuration according to the present embodiment can reduce the intensity of a reflected image formed by each diffraction light and reduce unwanted reflections blocking the view of the image display apparatus.

As described above, the configuration of the image display apparatus 100 according to the present embodiment can reduce the outside light reflected light by providing the periodic structure 105 between the front layer 101 and the luminescent layer 104 illustrated in FIG. 2 and thus can provide an image display apparatus which has a high contrast. Further, the periodic structure 105 is provided such that the length of the grating period 12 of the periodic structure 105 is equal to or greater than 1.0 μm to generate a large number of reflected diffraction light beams. Thereby, the present embodiment can provide an image display apparatus which reduces contrast variation due to variation of the environment and reduces the effect of unwanted reflections.

Here, it is desirable that the periodic structure 105 is included a medium satisfying the relation of the following expression 4.

$$0.8 \leq N_{12}/N_{sub} \qquad \text{Expression 4}$$

In the expression 4, $N_{sub}$ denotes the refractive index of a medium constituting the front layer 101, and $N_{12}$ denotes the refractive index of a medium, whichever the refractive index is lower, of the first medium and the second medium constituting the periodic structure 105. Of the first medium or the second medium constituting the periodic structure 105, a medium, whichever the refractive index is lower, is referred to as a third medium. The intensity of the specularly reflected light occurring at an interface between the front layer 101 and the periodic structure 105 depends on the reflectance at each interface between the front layer 101 and the first medium and the second medium constituting the periodic structure 105. When the third medium has a lower refractive index than the front layer 101, a light beam with a large incident angle is fully reflected on an interface between the front layer 101 and the third medium. When light is incident on the image display apparatus 100 from outside thereof, the light is diffracted at an interface between the air which is an external region and the front layer 101, propagates in the front layer 101, and is incident on the periodic structure 105. When light with a large incident angle is incident, the light propagates in the front layer 101 at an angle near the critical angle at an interface between the air and the front layer 101. When the third medium has a refractive index near the air which is an external region, the critical angle at an interface between the front layer 101 and the third medium comes close to the critical angle at an interface between the air and the front layer 101. When light with a large incident angle is incident on the image display apparatus 100 from outside thereof, the reflectance of the interface between the front layer 101 and the third medium becomes a large value near total reflection and the regular reflectance is increased. The critical angle at an interface between the different media is determined by the arcsine of a value obtained by dividing the refractive index of a medium on a side through which light is transmitted by the refractive index of a medium on an incident side. The smaller the divided value, the smaller the critical angle, and thus the regular reflectance is increased relating to light with a large incident angle.

Figure 8:
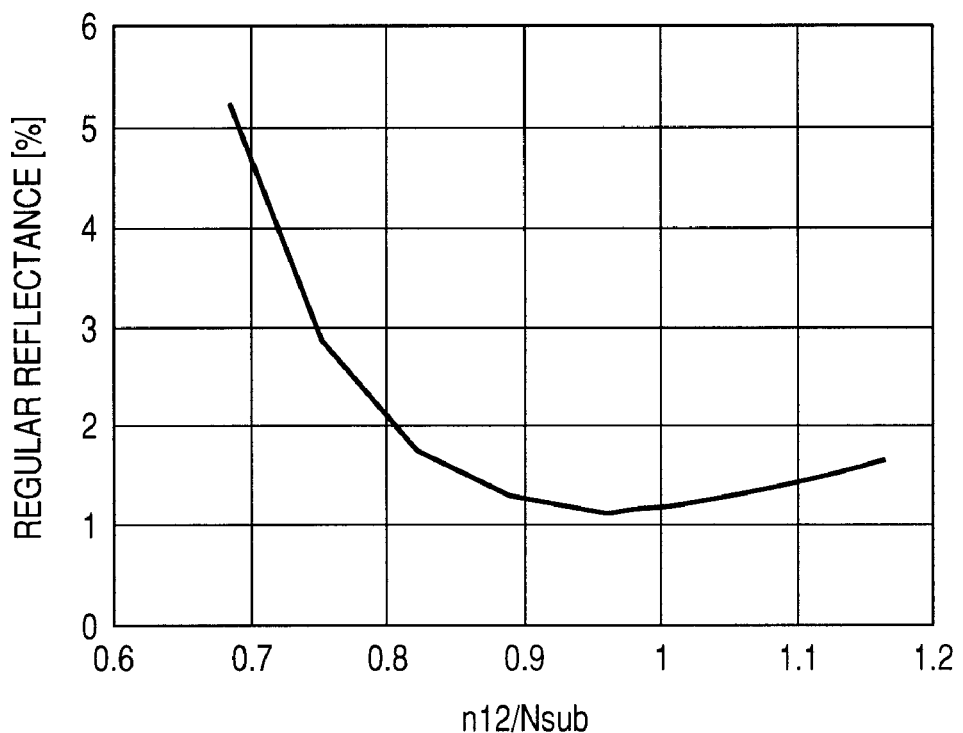
FIG. 8 is a graph illustrating the results of calculating a regular reflectance according to the first embodiment of the present invention.

By referring to FIG. 8, the description will focus on the regular reflectance generated by the periodic structure 105 when an outside light beam is made incident on the image display apparatus 100 according to the present embodiment. In FIG. 8, the horizontal axis indicates values obtained by dividing a refractive index of the first medium by a refractive index of the front layer and the vertical axis indicates regular reflectance. The incident outside light contains wavelengths from 400 nm to 700 nm and is incident in a range from 0 to 90 degrees to a direction perpendicular to the image display apparatus 100. The image display apparatus 100 and the periodic structure 105 have the same configurations as the configurations in FIGS. 1 and 2 such that the grating period 12 is 1700 nm, the diameter 13 of the cylinder 11 is 850 nm, and the length 14 in the xz cross section of the periodic structure 105 is 850 nm. The refractive index of the front layer 101, the luminescent layer 104, and the second medium constituting the periodic structure 105 is the same as the refractive index of the configuration in FIG. 1, but the refractive index of the first medium constituting the periodic structure 105 is changed. Note that reflected light at an interface between the front layer 101 and the external region and reflected light from an interface between the luminescent layer 104 and the rear region are ignored. Moreover, the regular reflectance is calculated by the transfer matrix method. As illustrated in FIG. 8, regular reflectance can be reduced by increasing the value obtained by dividing the refractive index of the first medium by the refractive index of the front layer. In particular, when the value obtained by dividing the refractive index of the first medium by the refractive index of the front layer is equal to or greater than 0.8, the regular reflectance can be reduced. As described above, the image display apparatus 100 according to the present embodiment is configured such that the periodic structure 105 and the front layer 101 is included a medium satisfying the conditions of the expression 4, and thus can provide an image display apparatus which reduces regular reflectance and reduces the effect of unwanted reflections.

It is possible to reduce reflections occurring at an interface between the periodic structure 105 and adjacent layers due to a difference in refractive index by approximating the refractive indices of the first medium and the second medium to the refractive indices of the media constituting layers adjacent to the periodic structure 105. Then, it is possible to reduce outside light reflectance of the image display apparatus. It is possible to reduce reflections occurring at an interface between the periodic structure 105 and adjacent layers by approximating the effective refractive index of the periodic structure 105 to the refractive indices of the media constituting layers adjacent to the periodic structure 105. For example, according to the present embodiment, it is possible to reduce outside light reflected light generated by the periodic structure 105 by approximating the refractive indices of the transparent electrode of the excitation source 103 provided between the luminescent layer 104 and the periodic structure 105 and of the front layer 101 to the effective refractive index of the periodic structure 105. It is desirable to select the first medium and the second medium constituting the periodic structure and the filling rates $f_1$ and $f_2$ of respective media such that the effective refractive index of the periodic structure 105 satisfies the conditions of the following expression 5.

$$|N_{eff} - N| \leq 0.7 \qquad \text{Expression 5}$$

In the expression 5, N denotes the refractive index of a medium constituting layers adjacent to the periodic structure 105. It is further desirable that an image display apparatus which further reduces outside light reflectance can be obtained by satisfying the conditions of the following expression 6.

$$|N_{eff} - N| \leq 0.6 \qquad \text{Expression 6}$$

The effective refractive index $N_{eff}$ of the periodic structure 105 and the intensity of high order diffraction light are appropriately designed by controlling the first medium and the second medium constituting the periodic structure 105 and the filling rates $f_1$ and $f_2$ of respective media. This can provide an image display apparatus which can increase the luminance of display light as well as can reduce outside light reflected light and has a high contrast.

Note that the first medium and the second medium constituting the periodic structure 105 included in the present invention may be media different from the media illustrated in the present embodiment. The intensity of high order diffraction light generated by the periodic structure 105 can be enhanced by increasing the difference in refractive index between the first medium and the second medium. As described above, this can improve the reduction effect of specularly reflected light (zeroth order reflected diffraction light) of the image display apparatus and the increase effect of the luminance of display light.

Moreover, the length 14 in the yz cross section of the periodic structure 105 included in the present invention may be different from the length in the present embodiment. When the length 14 in the yz cross section is varied, the diffraction efficiency of each diffraction order to each incident angle of display light and outside light is varied. Light generated by the luminescent layer 104 is incident on the periodic structure 105 at various angles. Meanwhile, when outside light is incident on the front layer 101 from the external region, the outside light is diffracted and is incident on the periodic structure 105 at a small angle within the critical angle between the front layer 101 and the external region. Therefore, optimum diffraction characteristics required for the periodic structure 105 are different between display light and outside light. An appropriate design of the length 14 in the yz cross section of the periodic structure 105 allows reduction of diffusely reflected light as well as improvement in luminance of display light. Thus, it is desirable to select the length 14 in the yz cross section so as to satisfy the conditions of the following expression 7.

$$D > 0.5 * w \quad \text{Expression 7}$$

In the expression 7, D denotes the length 14 in the yz cross section of the periodic structure 105, and w denotes the diameter of the cylindrical structure 11 included in the periodic structure 105 in a surface parallel to the front layer (screen). It is further desirable to reduce diffusely reflected light as well as improve the luminance of display light by selecting the length 14 in the yz cross section so as to satisfy the conditions of the following expression 8.

$$D > 0.75 * w \quad \text{Expression 8}$$

An appropriate design of the length in the yz cross section of the periodic structure 105 can provide an image display apparatus which increases the luminance of the display light as well as reduces diffusely reflected light and has a high contrast.

Note that the front layer 101 included in the present invention may be included any material transparent to visible light such as plastics. Moreover, the excitation source 103 may be configured by arranging an electron emission element and an electrode on the substrate and providing the electrode on a rear surface of the luminescent layer 104. In this configuration, when an electric field is applied to the electron emission element, electrons are released to the luminescent layer and the electrons are supplied to the luminescent layer 104, where light is produced. Alternatively, the excitation source 103 may be configured such that an anode and a cathode are provided between the front layer 101 and the luminescent layer 104 and on the rear surface of the luminescent layer 104. The luminescent layer 104 can be caused to emit light by applying current between both electrodes and injecting electrons and holes. Alternatively, the excitation source 103 may be configured such that electrodes are arranged on the substrate, and cells and the electrodes are arranged on the front surface or the rear surface of the luminescent layer 104. The cells are filled with a gas which generates plasma and produces ultraviolet light by applying current. In such a configuration, when current is applied to the gas contained in the cells, ultraviolet light is produced to irradiate phosphor particles which are then excited. The periodic structure 105 is not limited to the structure illustrated in FIG. 5, but may be any structure having different structure parameters.

The triangular lattice structure has a good structural symmetry and a less angle dependency of light incident on the periodic structure, and thus can reduce the angle dependency of the intensity of outside light reflected light and display light from the image display apparatus 100. Alternatively, the periodic structure 105 may not have a triangular lattice structure but may have any lattice-shaped structure such as a square lattice structure and a rectangular lattice structure. Such a structure can be easily fabricated by applying a resist to a processed substrate, forming a resist mask with a pattern by performing twice the two-beam interference exposure and development, and etching the processed substrate. Alternatively, the structure may be a structure having a one-dimensional periodic refractive index distribution or a structure having a three-dimensional periodic refractive index distribution. Further, the periodic structure 105 may be included three or more media having a different refractive index. Alternatively, the periodic structure 105 may be included the same medium as the medium of the front layer 101. The luminescent layer 104 may be configured by diffusely arranging the phosphor particles in a medium having the same refractive index as the refractive index of the phosphor particles. Such a configuration can reduce diffuse reflections occurring due to the difference between refractive indices at an interface between the phosphor particles and the periphery thereof, and can suppress diffuse reflections occurring on the luminescent layer. Note that the luminescent layer 104 may be a medium other than the medium having the refractive index shown in the present embodiment.

Second Embodiment

Figure 9:
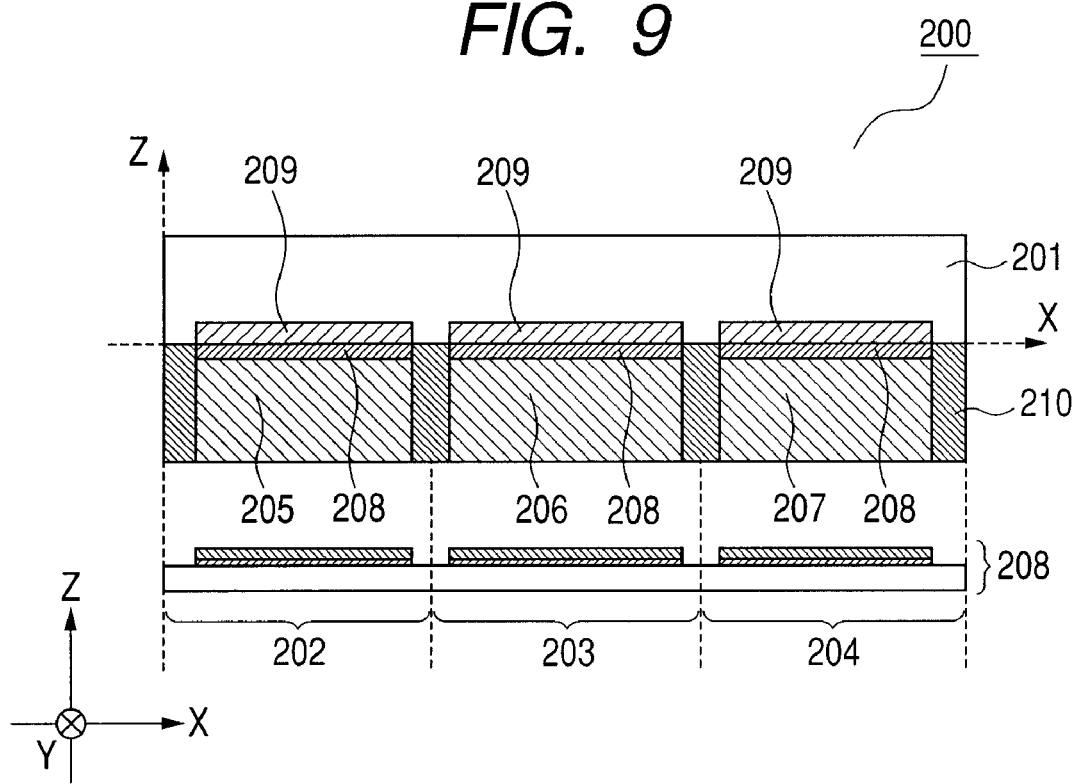
FIG. 9 is an xz cross-sectional view describing a configuration of an image display apparatus according to a second embodiment of the present invention.
Figure 10A:
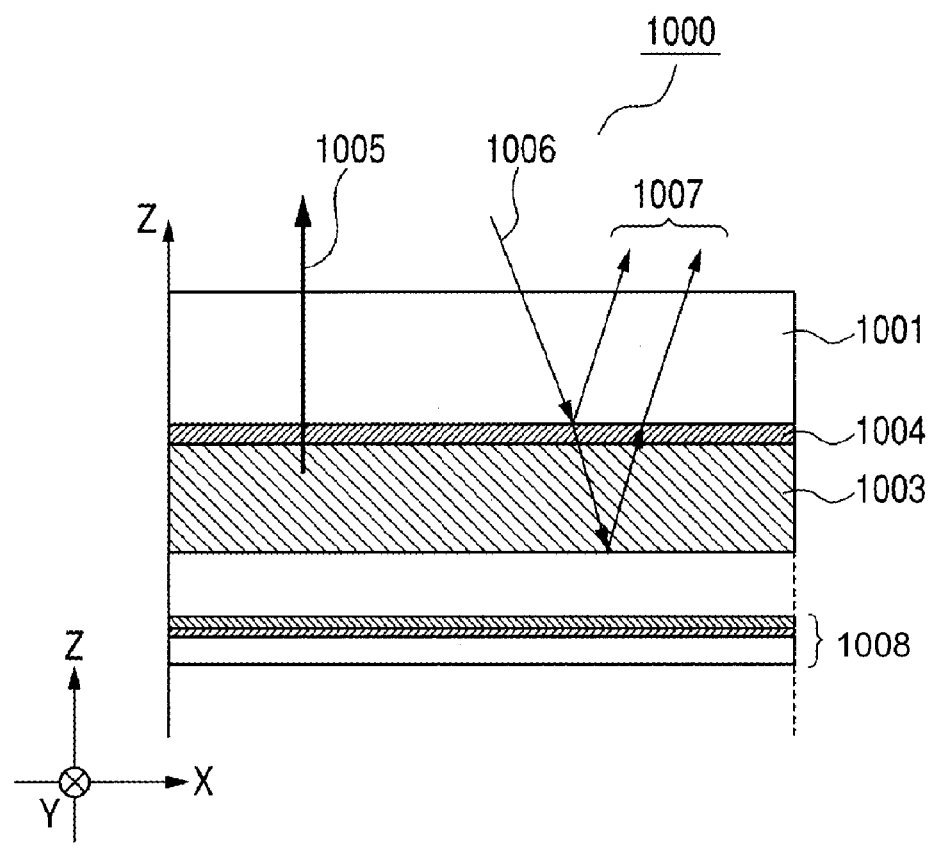
FIGS. 10A and 10B each describe a configuration of an image display apparatus according to a conventional example.
Figure 10B:
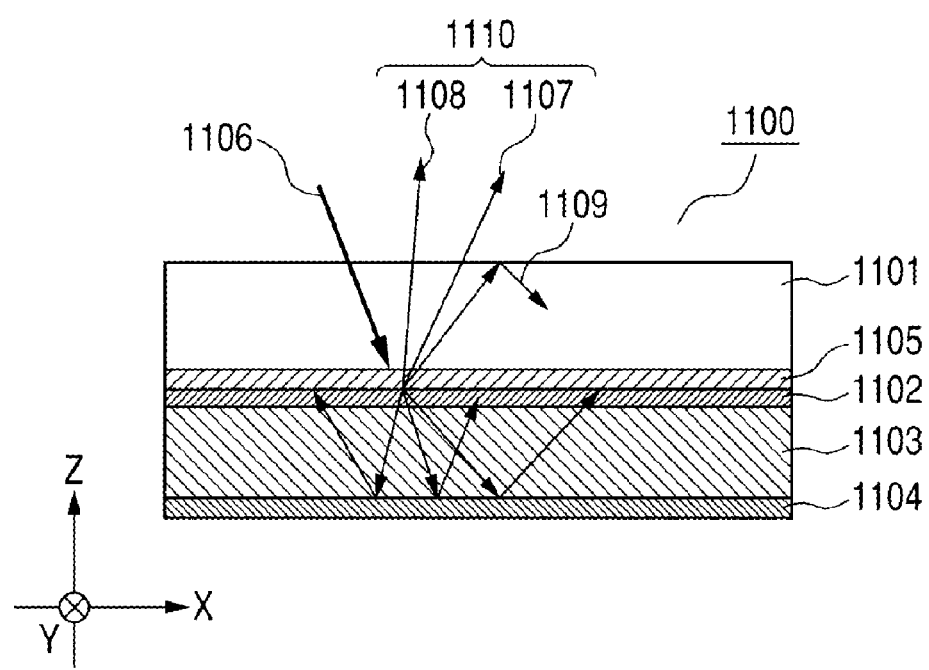

By referring to FIG. 9, the description will focus on a configuration example of an image display apparatus in which the luminescent layer according to the present embodiment is configured to include a luminescent layer for each color emitting color light beams such as red, green, and blue; and a periodic structure having the same medium and the same structure is arranged on each of the luminescent layers for each color. The image display apparatus 200 illustrated by the xz cross sectional view of FIG. 9 is configured to include a front layer 201 and pixels 202, 203, and 204 displaying red, green, and blue respectively. The pixels 202, 203, and 204 are arranged on a rear surface of the front layer 201. Each pixel is partitioned by a partition wall 210 included a medium having light absorption properties. FIG. 9 illustrates three pixels 202, 203, and 204 and the image display apparatus 200 is configured by arranging a plurality of such pixels. The front layer 201 is included a medium transparent to visible light such as glass. The pixels 202, 203, and 204 are configured to include luminescent layers 205, 206, and 207; periodic structures 209; and excitation sources 208. The periodic structures 209 are arranged on a front surface of the luminescent layers 205, 206, and 207; and the excitation sources 208 are arranged between the luminescent layers 205, 206, and 207 and the front layer 201. The luminescent layers 205, 206, and 207 of each pixel include a fluorescent material which emits light with a wavelength of red, green, and blue.

The periodic structure 209 is configured to include two kinds of media having a different refractive index and has a structure having a periodic refractive index distribution in the xy plane. Moreover, the period of the refractive index distribution is equal to or greater than 1 μm in length. The periodic structures 209 having the same medium and the same structure are arranged on each of the pixels 202, 203, and 204. The excitation source 208 is a layer including a unit for injecting electrons into the luminescent layers 205, 206, and 207. For example, the excitation source 208 is configured by arranging an electron emission element and an electrode on the substrate and providing the electrode on a surface of the luminescent layer 205, 206, and 207. In this configuration, when an electric field is applied to the electron emission element, electrons are released to the luminescent layers and the electrons are supplied to the luminescent layers 205, 206, 207, where light is produced. The produced light is transmitted through the periodic structures 209 and the front layer 201 and is extracted outside to form display light.

In the image display apparatus 200 according to the present embodiment, the period of the refractive index distribution in the xy plane of the periodic structure 209 is equal to or greater than 1 μm in length. Then, the effective refractive index of the periodic structure 209 is controlled by appropriately designing the filling rate of each medium constituting the periodic structure 209 and each medium contained in the periodic structure 209, and the length in the xz cross section of the periodic structure 209 is appropriately designed. As described in the first embodiment, this can provide an image display apparatus which improves the luminance of display light in each pixel as well as reduces outside light reflectance and reduces the contrast variation and the effect of unwanted reflections. The image display apparatus 200 according to the present embodiment using the periodic structure 209 having the same medium and the same structure as each of the pixels 202, 203, and 204 can also provide an image display apparatus which has a small variation in display luminance for each pixel. The period of the refractive index distribution in the xy plane of the periodic structure 209 is equal to or greater than 1 μm in length, and a light beam incident on the periodic structure 209 from various directions is distributed to a large number of diffraction light beams. The intensity of each diffraction light beam is small and the variation in the intensity due to variation in wavelength of incident light is also small. The display light becomes light integrating a large number of transmitted diffraction light beams generated by a light beam incident on the periodic structure 209 from various directions. Therefore, a variation in wavelength of a light beam incident on the periodic structure 209 causes a small variation in luminance of display light, and thus can provide characteristics that there is a small difference in luminance of display light in each pixel. This can eliminate a need to fabricate a different structure depending on the pixel and thus facilitates the fabrication of the image display apparatus.

Note that in the image display apparatus 200 according to the present embodiment, the periodic structure 209 included in each pixel may have a mutually different structure. Alternatively, the periodic structure provided in any one of the pixels 202, 203, and 204 corresponding to red, green, and blue respectively may have a different structure from the periodic structure provided in other pixel. The above configuration can further improve the suppression effects of specularly reflected light and diffusely reflected light and the increase effects of display light, and thus can provide an image display apparatus which has a high contrast in comparison with the configuration in which periodic structures having the same structure are arranged in each pixel. Moreover, periodic structures provided in each pixel may be different from each other in thickness in the yz cross section. Alternatively, the period of the periodic structure may have a different length for each pixel and the medium constituting the periodic structure may has a different structure for each pixel. Likewise the first embodiment, the periodic structure included in the present invention may not have a triangular lattice structure but may have any lattice-shaped structure such as a square lattice structure and a rectangular lattice structure. Alternatively, a structure having a one-dimensional or three-dimensional refractive index distribution may be used. The periodic structure may be included three or more kinds of media having a different refractive index.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-174961, filed Jul. 28, 2009, which is hereby incorporated by reference herein in its entirety.

What is claimed is:

1. An image display apparatus comprising:
a luminescent layer;
an excitation source which excites the luminescent layer;
a front layer which obtains display light by transmitting light generated by the luminescent layer excited by the excitation source; and
a periodic structure provided between the front layer and the luminescent layer, the periodic structure including a periodic refractive index distribution in a surface parallel to the front layer,
wherein the periodic structure is configured to attenuate reflection of outside light incident into the front layer,
wherein the periodic structure satisfies a relation of a following expression (1) and a periodic interval of the periodic structure is equal to or greater than 1 μm and equal to or less than 3 μm,
wherein said expression (1) is given by, $$1 < N_{sub} \leq N_{eff}$$

where
$N_{eff}$ denotes an effective refractive index of the periodic structure, and
$N_{sub}$ denotes a refractive index of a medium constituting the front layer,
wherein the periodic structure has a two-dimensional periodic refractive index distribution in the surface parallel to the front layer,
wherein the periodic structure has a refractive index distribution in a triangular lattice shape, a square lattice shape, or a rectangular lattice shape, and
wherein the periodic structure has a structure in which in a layer comprised of a first medium, cylindrical structures comprised of a second medium different from the first medium are periodically arranged and has, the structure satisfying a relation of a following expression (7),
wherein said expression (7) is given by, $$D > 0.5 * w$$

where
D denotes a length of the cylindrical structure in a direction perpendicular to the front layer, and
w denotes a diameter of the cylindrical structure in a surface parallel to the front layer.

2. The image display apparatus according to claim 1, wherein the luminescent layer is comprised of a medium emitting light containing a wavelength in a wavelength range of 350 nm or more and 800 nm or less.

3. The image display apparatus according to claim 1, wherein the periodic structure is such that the periodic interval of the periodic structure is equal to or greater than 1.5 μm and equal to or less than 2.5 μm.

4. The image display apparatus according to claim 1, wherein the periodic structure has a structure satisfying a relation of a following expression (4), wherein said expression (4) is given by, $$0.8 \leq N_{12}/N_{sub}$$

where $N_{12}$ denotes a refractive index of a medium, whichever refractive index is smaller, of a plurality of media constituting the periodic structure.

5. The image display apparatus according to claim 1, wherein the periodic structure has a structure satisfying a relation of a following expression (8), wherein said expression (8) is given by, $$D > 0.75 * w.$$

6. The image display apparatus according to claim 1, wherein the excitation source is configured such that a transparent electrode is arranged between the luminescent layer and the periodic structure and an electron emission element is arranged in a region of a rear surface of the luminescent layer.

7. The image display apparatus according to claim 1, wherein the luminescent layer is comprised of a layer in which phosphor particles are diffused in a medium having the same refractive index as the refractive index of the phosphor particles.

8. The image display apparatus according to claim 1, wherein the luminescent layer is comprised of luminescent layers for each color which emits light of red, green, and blue, and each periodic structure having the same medium and the same structure is arranged in the luminescent layer for each color as the periodic structure.

9. The image display apparatus according to claim 1, wherein the periodic structure attenuates the reflection of outside light incident into the front layer by diffracting the outside light, at a boundary between the front layer and the periodic structure, into specularly reflected light and diffusely reflected light.

10. The image display apparatus according to claim 1, wherein, when the outside light is incident into the front layer at an incident angle of 0 degrees to 90 degrees, the periodic structure attenuates the reflection of the outside light by diffracting the outside light, at a boundary between the front layer and the periodic structure, so that outside light reflectance is maintained within 4% to 10%.

11. The image display apparatus according to claim 9, wherein diffraction efficiency of the specularly reflected light is equal to or less than 2% for diffraction orders within +2 and −2.

* * * * *